United States Patent
Kuramori

(10) Patent No.: US 8,559,244 B2
(45) Date of Patent: Oct. 15, 2013

(54) NON-VOLATILE STORAGE DEVICE

(75) Inventor: Bunsho Kuramori, Tokyo (JP)

(73) Assignee: Lapis Semiconductor Co., Ltd. (JP)

( * ) Notice: Subject to any disclaimer, the term of this patent is extended or adjusted under 35 U.S.C. 154(b) by 118 days.

(21) Appl. No.: 13/165,602

(22) Filed: Jun. 21, 2011

(65) Prior Publication Data

US 2011/0317498 A1    Dec. 29, 2011

(30) Foreign Application Priority Data

Jun. 23, 2010    (JP) .................................. 2010-143147

(51) Int. Cl.
    *G11C 7/06* (2006.01)
(52) U.S. Cl.
    USPC ............. 365/189.07; 365/189.09; 365/185.18
(58) Field of Classification Search
    USPC ............. 365/189.07, 189.09, 185.18, 185.21, 365/185.22
    See application file for complete search history.

(56) References Cited

U.S. PATENT DOCUMENTS

| | | | | |
|---|---|---|---|---|
| 7,460,409 B2 * | 12/2008 | Kuramori | .................. | 365/185.25 |
| 7,889,560 B2 * | 2/2011 | Guterman | ................ | 365/185.18 |
| 7,978,527 B2 * | 7/2011 | Hemink et al. | .......... | 365/185.22 |
| 2006/0087887 A1 * | 4/2006 | Kameda et al. | .......... | 365/185.21 |
| 2007/0013298 A1 * | 1/2007 | Tsujimura | ..................... | 313/504 |
| 2008/0043531 A1 * | 2/2008 | Kameda et al. | .......... | 365/185.11 |

FOREIGN PATENT DOCUMENTS

JP        2007-149296 A    6/2007

* cited by examiner

*Primary Examiner* — Gene Auduong
(74) *Attorney, Agent, or Firm* — Rabin & Berdo, P.C.

(57) ABSTRACT

There is provided a non-volatile storage device including: a memory array section arrayed with plural non-volatile memory cells for electronically writable data storage; plural bit lines that are connected to respective memory cells and have voltage levels that change according to the data stored in the memory cells; a supply section that supplies a voltage of a reference level to act as a comparator reference when determining data stored in the memory cells; a comparator section that compares the voltage level of the bit line connected to the memory cell subject to reading against the reference level supplied by the supply section; and a charging section that, in preparation for comparison by the comparator section, charges the bit line connected to the memory cell subject to reading to the voltage of the reference level supplied by the supply section.

5 Claims, 8 Drawing Sheets

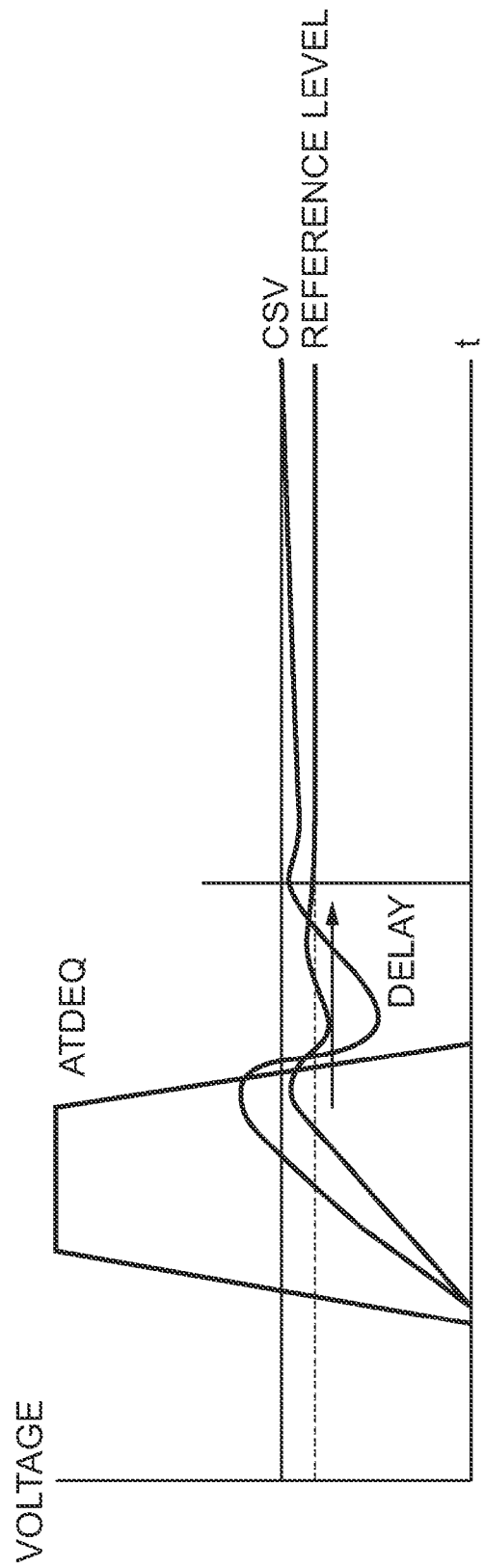

NON-VOLATILE STORAGE DEVICE

CROSS-REFERENCE TO RELATED APPLICATION

This application is based on and claims priority under 35 USC 119 from Japanese Patent Application No. 2010-143147 filed on Jun. 23, 2010, the disclosure of which is incorporated by reference herein.

BACKGROUND

1. Technical Field

The present invention relates to a non-volatile storage device with electronic writing capability.

2. Related Art

A non-volatile memory is traditionally formed, for example, with a memory array of plural memory cells respectively arrayed in word lines (WL) and bit lines (BL). The bit lines of the memory cell subject to reading are sequentially connected to a read amplifier through a selection circuit, and data is read out by comparing the voltage level of the bit line connected to the memory cell by the read amplifier against a reference level.

Each of the memory cells is stored with data of "1" or "0". The voltage level of the bit line changes according to the data stored in the memory cell subject to reading, however when, say, reading data "0" after reading data "1", it takes some time until the bit line is charged and achieves a stable state capable of determining a 0 read, causing access delay.

As a countermeasure to address this issue there is technology described in Japanese Patent Application Laid-Open (JP-A) No. 2007-149296 that speeds up data reading by pre-charging to an internal voltage CSV generated by an internal power source when reading data from a bit line.

However, the internal voltage CSV does not always match the reference level. Accordingly, when the internal voltage CSV is higher than the reference level, as shown in FIG. 10, overshoot sometimes occurs due to the bit line being charged to a voltage exceeding the reference level by pre-charging. When the interval voltage CSV is lower than the reference level, due to the bit line being charged after pre-charging it still takes some time to achieve a stable state although this is shortened due to pre-charging.

SUMMARY

In consideration of the above circumstances, an object of the present invention is to provide a non-volatile storage device enabling access delay to be further reduced.

In order to achieve the above object, a first aspect of the present invention provides a non-volatile storage device including:

a memory array section arrayed with plural non-volatile memory cells for electronically writable data storage;

plural bit lines that are connected to respective memory cells and have voltage levels that change according to the data stored in the memory cells;

a supply section that supplies a voltage of a reference level to act as a comparator reference when determining data stored in the memory cells;

a comparator section that compares the voltage level of the bit line connected to the memory cell subject to reading against the reference level supplied by the supply section; and a charging section that, in preparation for comparison by the comparator section, charges the bit line connected to the memory cell subject to reading to the voltage of the reference level supplied by the supply section.

According to the present invention, the memory array section is arrayed with plural non-volatile memory cells for electronically writable data storage, respective memory cells are connected by bit lines, and the voltage level of the bit lines changes according to the data stored in the memory cells.

The supply section supplies a voltage of the reference level to act as a comparator reference when determining data stored in the memory cells, the comparator section compares the voltage level of the bit line connected to the memory cell subject to reading against the reference level supplied by the supply section, and the charging section charges the bit line connected to the memory cell subject to reading to the voltage of the reference level supplied by the supply section, in preparation for comparison by the comparator section.

According to the first aspect of the present invention, the bit line connected to the memory cell subject to reading is charged to the reference level in preparation to comparing the voltage level of the bit line connected to the memory cell subject to reading against the reference level, enabling the access delay to be reduced.

A second aspect of the present invention provides the non-volatile storage device of the first aspect, further including:

an amplification section that respectively amplifies an electrical signal of the bit line connected to the memory cell subject to reading and a reference signal at the reference level supplied by the supply section, wherein the charging section charges the bit line connected to the memory cell to the voltage level prior to amplification, after amplification, or any combination thereof, by the amplification section.

A third aspect of the present invention provides the non-volatile storage device of the first aspect, further including:

a connection section that, in preparation for comparison by the comparator section, electrically connects the bit line connected to the memory cell subject to reading to a line through which the reference level reference signal flows.

A fourth aspect of the present invention provides the non-volatile storage device of the first aspect, wherein:

the memory array section comprises a reference memory cell stored with data employed for the reference level; and the supply section supplies a voltage level of the bit line connected to the reference memory cell as the reference level.

A fifth aspect of the present invention provides the non-volatile storage device of the first aspect, wherein:

the supply section is configured as a power supply circuit for supplying a reference signal having the voltage of the reference level.

A sixth aspect of the present invention provides the non-volatile storage device of the second aspect, wherein:

the amplification section constantly amplifies an electrical signal of the bit line connected to the memory cell for the duration that power is being supplied to the non-volatile storage device; and the supply section supplies the voltage level of the bit line connected to the memory cell as the reference level.

The non-volatile storage device of the present invention exhibits the excellent effect of enabling the access delay to be reduced.

BRIEF DESCRIPTION OF THE DRAWINGS

Exemplary embodiments of the present invention will be described in detail based on the following figures, wherein:

FIG. 10 is a waveform chart illustrating an example of changes to the voltage of a bit line in which overshoot has occurred.

DETAILED DESCRIPTION

Explanation follows regarding an exemplary embodiment of the present invention, with reference to the drawings.

First Exemplary Embodiment

Figure 1:
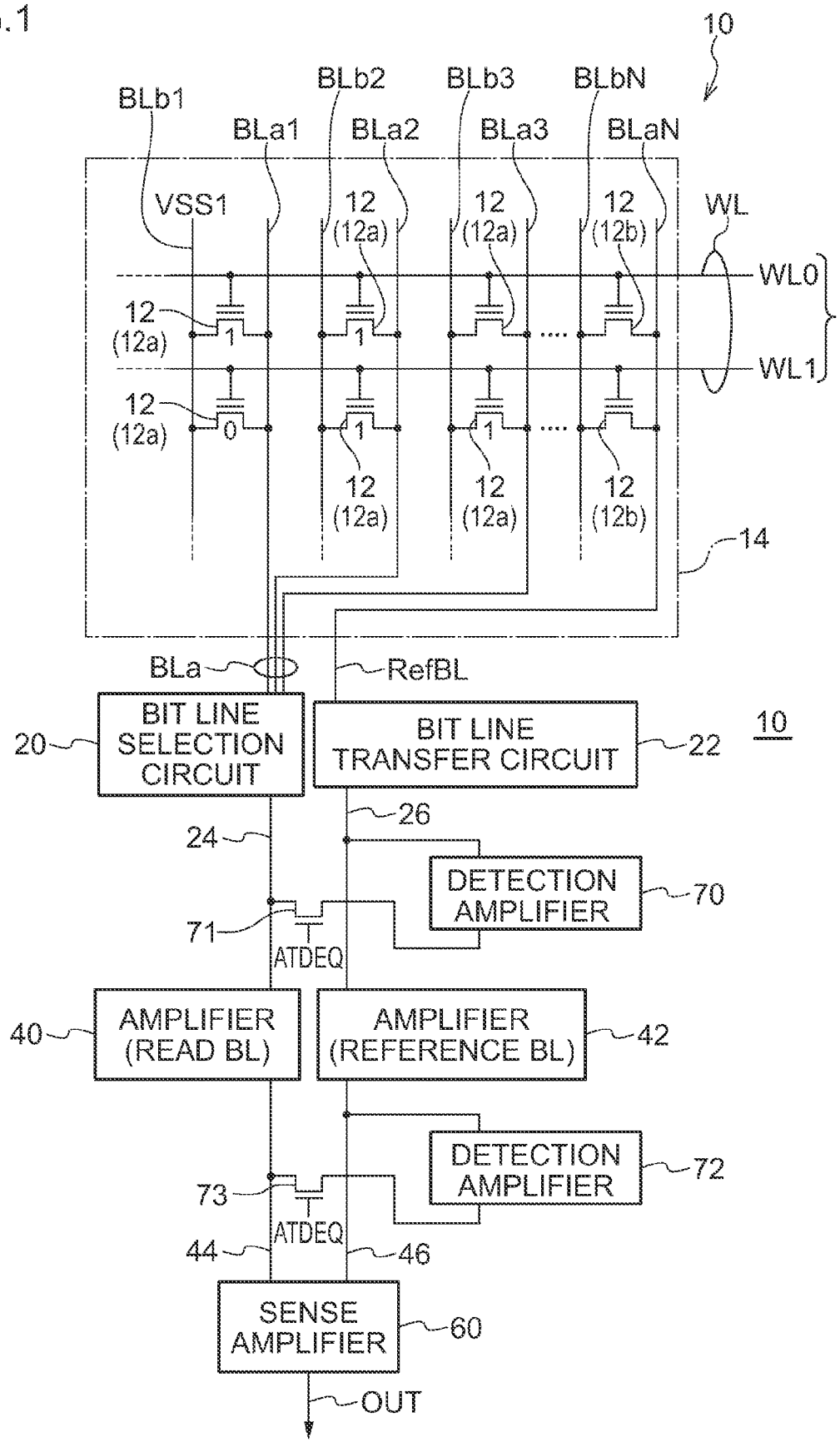
FIG. 1 is a block diagram illustrating a schematic configuration of a non-volatile memory according to a first exemplary embodiment.

FIG. 1 is a block diagram of a non-volatile memory 10 to which the present invention is applied. Note that in the following explanation portions that are not directly related to the present invention are abbreviated in the drawing and explanation.

As shown in FIG. 1, the non-volatile memory 10 of the first exemplary embodiment includes a memory cell array 14 provided plural memory cells 12 for storing data laid out in a matrix.

The memory cell array 14 has plural word lines WL (WL0, WL1 and so on) decoded by a given external address input and disposed parallel to each other. The memory cell array 14 also has plural first bit lines BLa (BLa0, BLa1 to BLaN) for data transmission disposed parallel to each other at a specific separation interval along a direction orthogonal to the plural word lines WL. Plural second bit lines BLb (BLb0, BLb1 to BLbN) for electrical potential lowering are provided parallel to and in the vicinity of each of the respective first bit lines BLa.

The respective word lines WL are connected at each floating gate of the respective memory cell 12, the first bit lines BLa are connected to the sources of the respective memory cells 12, and the second bit lines BLb are connected to the drains of the respective memory cells 12.

In the non-volatile memory 10 of the first exemplary embodiment, the memory cells 12 are divided into plural memory cells 12a for storing actual data and memory cell(s) 12b (acting as supply sections) for storing reference levels for use as comparators. In the first exemplary embodiment, the memory cells 12b for storing the reference level are configured by a row of plural memory cells 12 at one side of the memory cell array 14.

A reading circuit is connected to the memory cell array 14 for reading out data from each of the memory cells 12. The reading circuit includes: a bit line selection circuit 20 for selecting between the bit lines (BLa0, BLa1 to BLaN−1) connected to the plural memory cells 12a for storing actual data; a bit line transfer circuit 22 connected to the comparator memory cells 12b through the bit lines BLaN; an amplifier 40 that is connected to the bit line selection circuit 20 through a connection line 24 and amplifies an electrical signal coming out of the bit line at the memory cell 12a side selected and read out by the bit line selection circuit 20; an amplifier 42 that is connected to the bit line transfer circuit 22 through a connection line 26 and amplifies a reference signal coming out of the bit line BLaN of the comparator memory cell 12b side at a reference level that acts as a comparator reference during data determination; and a sense amplifier 60 (serving as a comparator section) connected to the amplifier 40 and the amplifier 42 through respective connection lines 44, 46 and configuring a difference amplifier for amplifying the difference in output voltage between the amplifier 40 and the amplifier 42. While not shown in the drawings, the non-volatile memory 10 also includes an address circuit for selecting word lines WL and a writing circuit for writing data.

Figure 2:
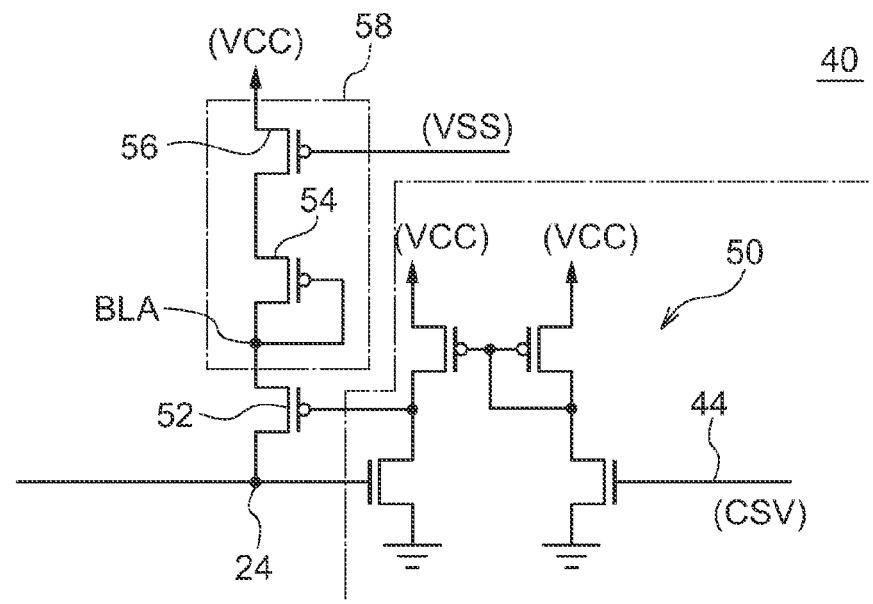
FIG. 2 is a circuit diagram illustrating a configuration of amplifier.

FIG. 2 is a circuit diagram illustrating a circuit configuration of the amplifier 40.

The amplifier 40 is an amplification circuit equipped with a current mirror circuit 50 including a pair of Pch transistors and a pair of Nch transistors. The current mirror circuit 50 is connected to the Nch transistor 52. The Nch transistor 52 is connected to a node BLA of a circuit 58 containing two serially connected Pch transistors 54, 56, and connected through the connection line 24 to the bit line selection circuit 20.

Figure 3:
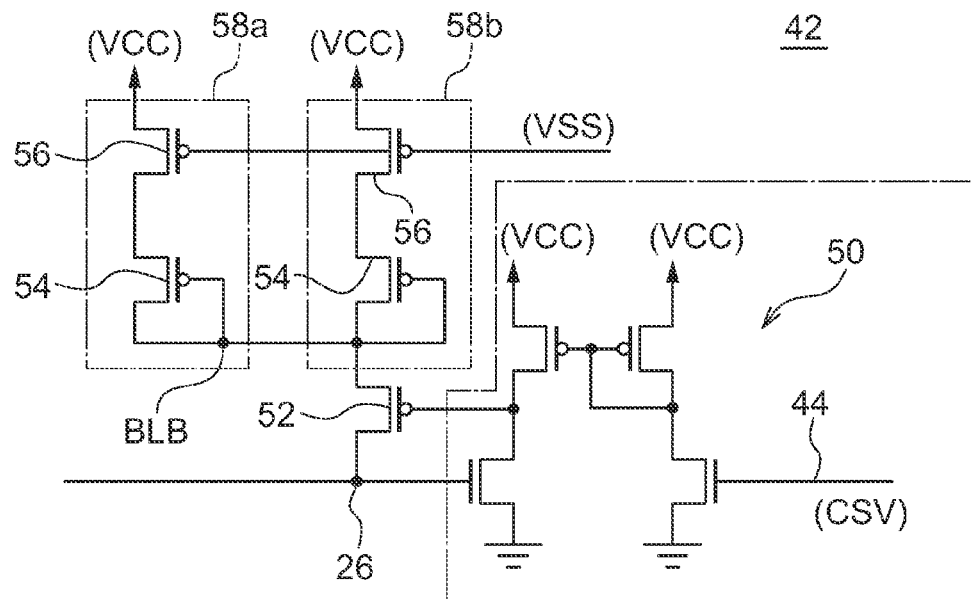
FIG. 3 is a circuit diagram illustrating a configuration of amplifier.

FIG. 3 is a circuit diagram illustrating a circuit configuration of the amplifier 42.

The amplifier 42, similarly to the amplifier 40 of FIG. 2, is an amplification circuit equipped with a current mirror circuit 50 including a pair of Pch transistors and a pair of Nch transistors. The current minor circuit 50 is connected to the Nch transistor 52. The Nch transistor 52 is connected to a node BLB of two circuits 58a, 58b each containing two serially connected Pch transistors 54, 56 and connected through the connection line 26 to the bit line transfer circuit 22.

The amplifier 40 and the amplifier 42 are configured such that the circuit 58a and the circuit 58b, which are each similar to the circuit 58 shown in FIG. 2, are connected together in parallel.

The sense amplifier 60 is a circuit for outputting an output signal OUT of the signal read by amplification of the output voltage difference between the amplifier 40 and the amplifier 42, configured as an inverse difference amplification circuit by current mirroring.

The non-volatile memory 10 in the first exemplary embodiment also includes a detection amplifier 70 (serving as a charging section). As shown in FIG. 1, the detection amplifier 70 is connected to the connection line 26 that connects the bit line transfer circuit 22 and the amplifier 42, and is employed for detecting the reference level prior to amplification. The detection amplifier 70 detects the reference level prior to amplification, and outputs an electrical signal of the same voltage level. The output of the detection amplifier 70 is connected through a transistor 71 (serving as a charging section) to the connection line 24 that connects the bit line selection circuit 20 and the amplifier 40.

The non-volatile memory 10 in the present exemplary embodiment also includes a detection amplifier 72 (serving as a charging section). The detection amplifier 72 is connected to a connection line 46 that connects the amplifier 42 and the sense amplifier 60, and is employed for detecting the reference level post amplification. The detection amplifier 72 detects the reference level post amplification, and outputs an electrical signal of the same voltage level. The output of the detection amplifier 72 is connected through a transistor 73

(serving as a charging section) to a connection line 44 that connects the amplifier 40 and the sense amplifier 60.

The transistors 71, 73 pre-charge a bit line by the gates of the transistors 71, 73 being input with a signal Address Transition Detect Equalizer (ATDEQ) from an equalizer for detecting address transition, and by supplying the output voltages of the detection amplifiers 70, 72 to the connection lines 24, 44 according to the signal ATDEQ.

Figure 4:
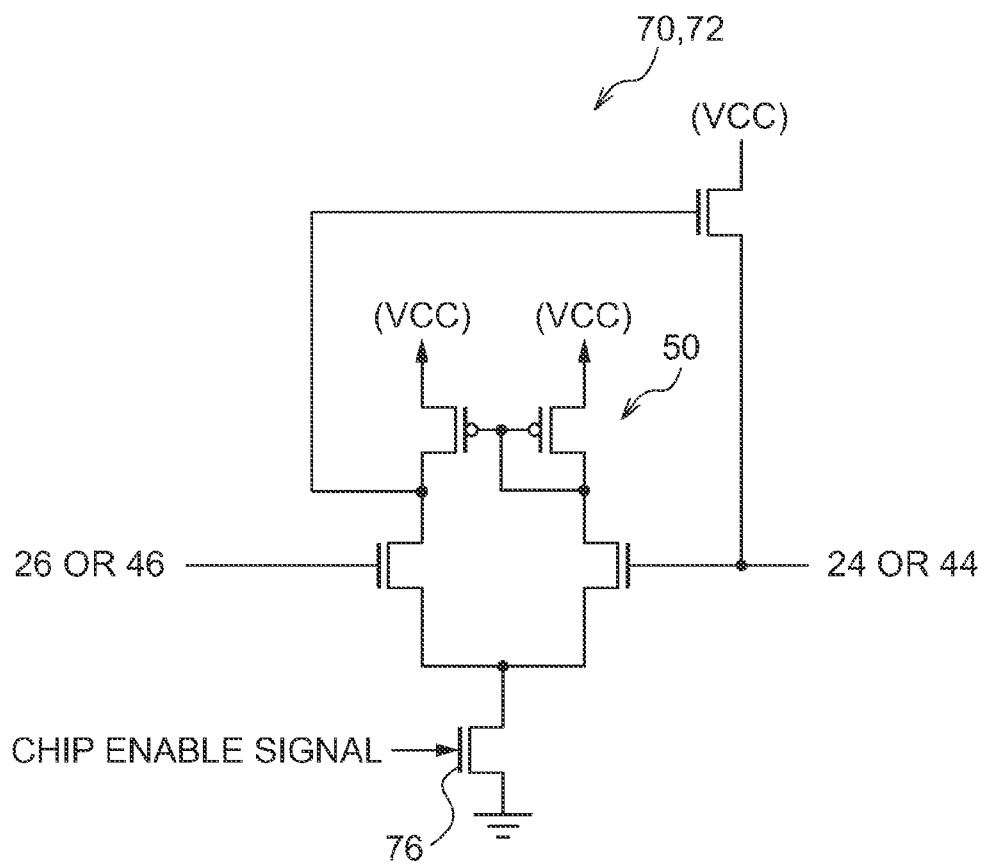
FIG. 4 is a circuit diagram illustrating a configuration of detection amplifier.

FIG. 4 is a circuit diagram illustrating a circuit configuration of the detection amplifiers 70, 72.

The detection amplifiers 70, 72 are both amplification circuits equipped with respective current mirror circuits 50 that each have a pair of Pch transistors and pair of Nch transistors. Each of the current minor circuits 50 is either connected to the connection line 26 or the connection line 46. Each of the current minor circuits 50 is connected to GND through a transistor 76, and performs detection operation for the period during which a chip enable signal is input to the transistor 76.

Explanation now follows regarding operation of the non-volatile memory 10 according to the present exemplary embodiment.

In order to read out data, a specific voltage for reading is applied in sequence to each of the word lines WL. Accordingly, a current flows in each of the first bit lines BLa according to the injected state of electrons in the floating gate of each of the memory cells 12 connected to the word line WL to which the read voltage has been applied.

An electrical signal of the reference level is input to the bit line transfer circuit 22 from the comparator memory cell 12b through the bit line BLaN, and an electrical signal according to actual data is input to the bit line selection circuit 20 from the actual data memory cells 12a through the respective actual data bit lines (BLa0 to Bla (N−1)).

The reference level electrical signal input to the bit line transfer circuit 22 is amplified in the amplifier 42 and then output. When the non-volatile memory 10 enters the operating state and a chip-enable signal is input the detection amplifiers 70, 72 are activated, detect the reference level prior to amplification in the amplifier 42 and the reference level post amplification in the amplifier 42, respectively, and output electrical signals of the same voltage level.

In the bit line selection circuit 20, for the duration during which a read voltage is applied to a single word line WL, the bit lines (BLa0 to Bla (N−1)) connected to the plural memory cells 12a storing data are sequentially selected and read, and connecting the bit line BLa of the memory cell 12a side to the amplifier 40. The electrical signal selected by the bit line selection circuit 20 is amplified in the amplifier 40 and then output.

Figure 5:
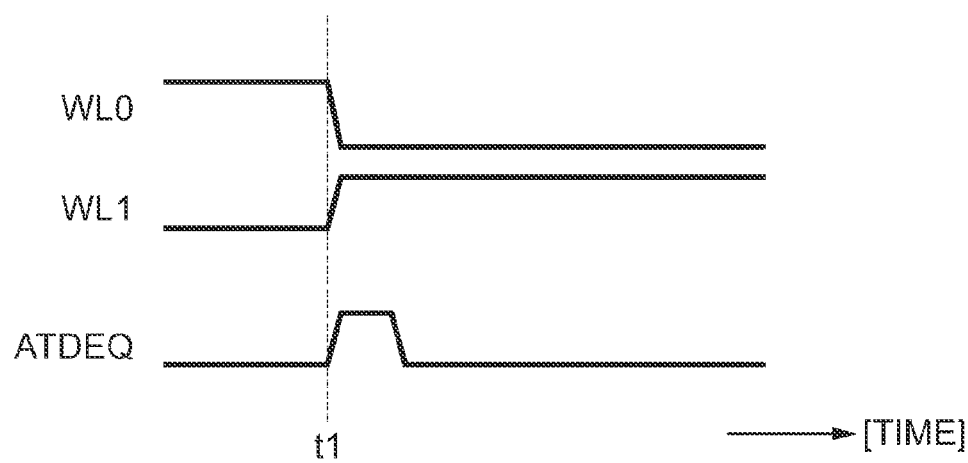
FIG. 5 is a waveform chart illustrating timing in a switching operation of a word line.

In the non-volatile memory 10 according to the first exemplary embodiment, as shown in FIG. 5, in order to read out data, a high level signal ATDEQ is generated when switching between each of the word lines WL, namely when switching the memory cell being read (time t1).

The transistors 71, 73 are turned on in response to the signal ATDEQ, and pre-charge the bit lines by supplying the output voltages of the detection amplifiers 70, 72 to the connection lines 24, 44, respectively.

The electrical potential of the connection lines 24, 44 can thereby be raised at high speed, including charging for the parasitic capacity. The reference levels are pre-charged to the connection lines 24, 44, and since pre-charging to the connection line 44 is the reference level of a voltage amplified at the same amplification ratio as the amplification ratio of the actual data bit lines BLa, the time after the transistors 71, 73 have been turned off until the electrical potential of the connection lines 24, 44 achieves a stable state can be shortened, without generating overshoot.

Figure 6:
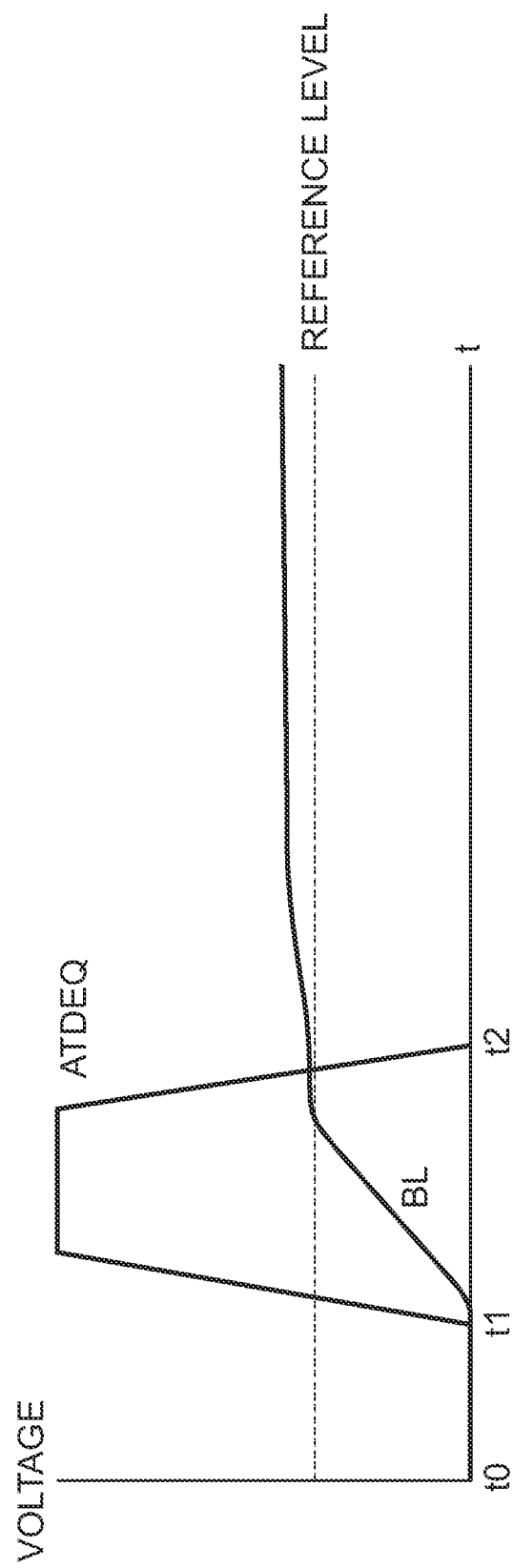
FIG. 6 is a waveform chart illustrating an example of changes to the voltage of a bit line when reading data.

FIG. 6 shows an example of changes in voltage of the connection line 24 when reading data from a memory cell.

The connection line 24 initially has a lower voltage than the reference level (in the period from t0 to t1). In order to read data from the memory cell, the transistor 71 is turned on in response to the signal ATDEQ (in the period t1 to t2), and the connection line 24 is pre-charged to the reference level prior to amplification by the amplifier 42.

When the transistor 71 is turned off, the voltage changes in the connection line 24 according to the injection state of electrons in the floating gate of the memory cell subject to reading, however due to being pre-charged to the reference level, the connection line 24 achieves a stable state in a short period of time, and hence reading of data can be speeded up.

Second Exemplary Embodiment

Explanation now follows regarding a second exemplary embodiment.

Figure 7:
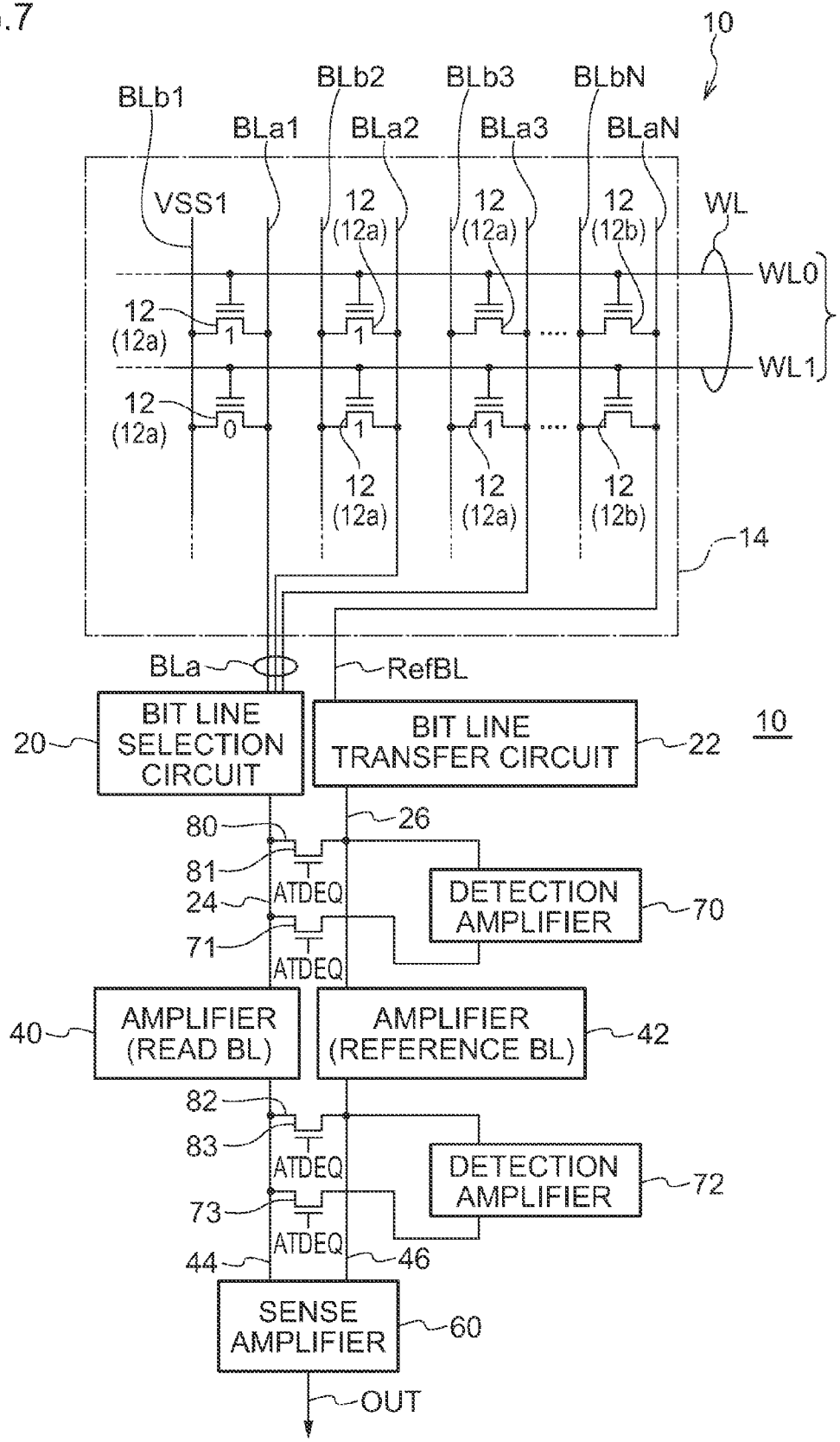
FIG. 7 is a block diagram illustrating a schematic configuration of a non-volatile memory according to a second exemplary embodiment.

FIG. 7 is a block diagram of a non-volatile memory 10 according to the second exemplary embodiment. Portions similar to those of the first exemplary embodiment (see FIG. 1) are allocated the same reference numerals and further explanation thereof is omitted.

In the non-volatile memory 10 of the present exemplary embodiment, the connection line 24 and the connection line 26 are connected together by a connection line 80 through a transistor 81, and the connection line 44 and the connection line 46 are connected together by a connection line 82 (serving as a connection portion) through a transistor 83.

The signal ATDEQ is input to the gates of the transistors 81, 83, and the transistors 81, 83 are turned on or off according to the signal ATDEQ.

Explanation now follows regarding operation of the non-volatile memory 10 according to the second exemplary embodiment.

In the non-volatile memory 10, similarly to in the first exemplary embodiment, the transistors 71, 73 are turned on in response to the signal ATDEQ generated when switching memory cells, and when the transistors 71, 73 are turned on the voltage outputs of the detection amplifiers 70, 72 pre-charge the connection lines 24, 44, respectively.

In the non-volatile memory 10 of the second exemplary embodiment, the transistors 81, 83 are turned on in response to the signal ATDEQ, and the connection line 24 and the connection line 26 become electrically contiguous through the connection line 80, and the connection line 44 and the connection line 46 become electrically contiguous through the connection line 82, equalizing their respective voltage levels.

The detection amplifiers 70, 72 are formed with circuits to output electrical signals of the same voltage level as the detected voltage levels, however sometimes there is variation of their output electrical signal voltage levels from the detected voltage levels due to variation when forming the circuits, for example.

However by, as in the second exemplary embodiment, providing the connection line 80 for connecting the connection line 24 and the connection line 26, and providing the connection line 82 for connecting the connection line 44 and the connection line 46, when switching memory cells the voltage levels of the connection line 24 and the connection line 26, and the voltage levels of the connection line 44 and the connection line 46 can be equalized to the same levels by shorting to make the connection line 24 and the connection line 26 electrically contiguous and the connection line 44 and the connection line 46 electrically contiguous. Accordingly, even for cases in which electrical signals cannot be output of the same voltage levels to the voltage levels detected by the detection amplifiers 70, 72, since the connection line 24 and the connection line 26, and the connection line 44 and the connection line 46, are pre-charged to the same respective voltage levels, duration until a stable state is achieved when reading data can be shortened, and a higher speed of data reading can be achieved.

Figure 8:
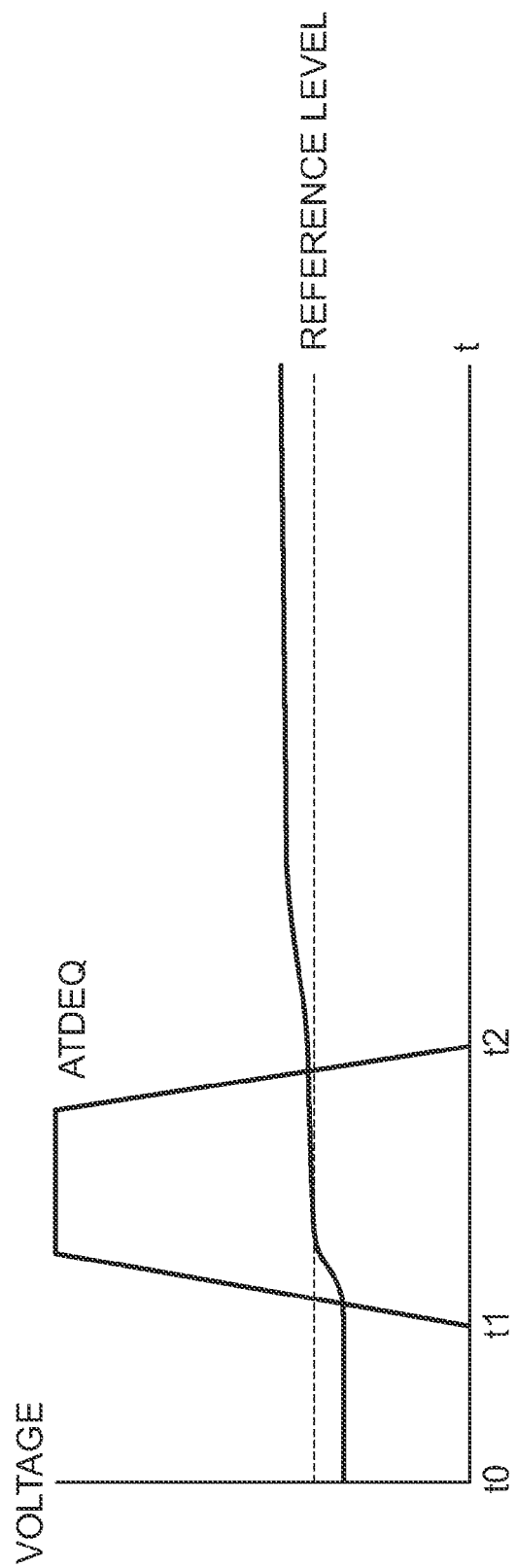
FIG. 8 is a waveform chart illustrating an example of changes to the voltage of a bit line when reading data.

FIG. 8 shows an example of changes to the voltages of the connection line 26 and the connection line 44.

Initially (during period t0 to t1) the connection line 44 is at a lower voltage level than the connection line 26 charged to the reference level by the detection amplifier 70. In order to read data from a memory cell, the transistor 71 and the transistor 81 are turned on in response to the signal ATDEQ (during period t1 to t2), the connection line 24 is pre-charged to the reference level prior to amplification by the amplifier 42, and the connection line 24 and the connection line 26 are made electrically contiguous through the connection line 80, such that the connection line 24 and the connection line 26 are pre-charged to the same voltage level.

When the transistor 71 is turned off, the voltage of the connection line 24 changes according to the injection state of electrons in the floating gate of the memory cell subject to reading, and due to the pre-charging a higher speed of data reading can be achieved since a stable state is achieved in a short period of time.

Figure 9:
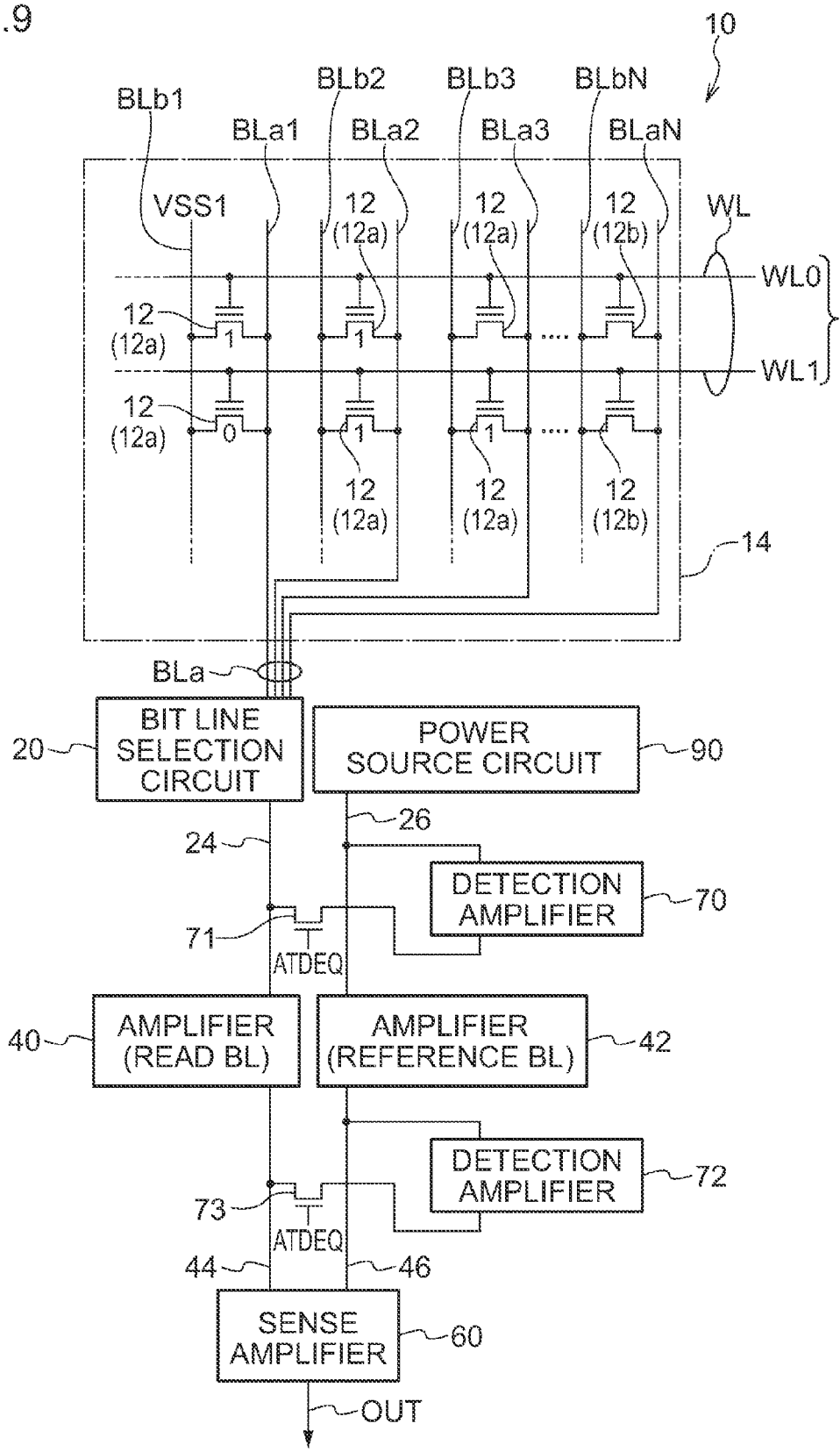
FIG. 9 is a block diagram illustrating a schematic configuration of a non-volatile memory according to another exemplary embodiment.

Note that while explanation in the above exemplary embodiments are of cases in which the reference memory cells 12b stored with reference level data are provided to the memory cell array 14 and the voltage level of the bit line BLaN connected to the memory cells 12b is employed as the reference level, there is no limitation thereto. For example, as shown in FIG. 9, a dedicated power source circuit 90 may be provided for supplying a reference level. The memory cell array 14 can be configured entirely of actual data memory cells 12a by adopting such a configuration.

Furthermore, while explanation in the above exemplary embodiments are of cases in which the reference memory cells 12b are provided in the memory cell array 14 at a ratio of one for each of the word lines WL, there is no limitation thereto. For example, a single reference memory cell 12b may be provided, and the reference level supplied from this memory cell 12b.

Furthermore, while explanation in the above exemplary embodiments are of cases in which the detection amplifiers 70, 72 detect the voltage level of the connection lines 26, 46, respectively, and output electrical signals at the same respective voltage levels, there is no limitation thereto. For example, configuration may be made such that during the interval in which power is being supplied to the non-volatile memory 10, the amplifier 40 constantly performs amplification, the detection amplifiers 70, 72 constantly detect the voltage level of the connection lines 24, 44, respectively, and constantly output electrical signals the same as the detected voltage levels.

While explanation in the above exemplary embodiments is of cases in which a bit line is pre-charged with the voltage levels both prior to amplification and post amplification by the amplifier 40, there is no limitation thereto, and pre-charging may be performed by one or other of the above alone.

What is claimed is:

1. A non-volatile storage device comprising:
a memory array section arrayed with a plurality of non-volatile memory cells for electronically writable data storage;
a plurality of bit lines that are connected to respective memory cells and have voltage levels that change according to the data stored in the memory cells;
a supply section that supplies a voltage of a reference level to act as a comparator reference when determining data stored in the memory cells;
a comparator section that compares the voltage level of the bit line connected to the memory cell subject to reading against the reference level supplied by the supply section;
a charging section that, in preparation for comparison by the comparator section, charges the bit line connected to the memory cell subject to reading to the voltage of the reference level supplied by the supply section; and
an amplification section that respectively amplifies an electrical signal of the bit line connected to the memory cell subject to reading and a reference signal at the reference level supplied by the supply section,
wherein the charging section charges the bit line connected to the memory cell to the voltage level prior to amplification, after amplification, or any combination thereof, by the amplification section.

2. The non-volatile storage device of claim 1, further comprising:
a connection section that, in preparation for comparison by the comparator section, electrically connects the bit line connected to the memory cell subject to reading to a line through which the reference level reference signal flows.

3. The non-volatile storage device of claim 1, wherein:
the memory array section comprises a reference memory cell stored with data employed for the reference level; and
the supply section supplies a voltage level of the bit line connected to the reference memory cell as the reference level.

4. The non-volatile storage device of claim 1, wherein:
the amplification section constantly amplifies an electrical signal of the bit line connected to the memory cell for the duration that power is being supplied to the non-volatile storage device; and the supply section supplies the voltage level of the bit line connected to the memory cell as the reference level.

5. A non-volatile storage device comprising:
a memory array section arrayed with a plurality of non-volatile memory cells for electronically writable data storage;
a plurality of bit lines that are connected to respective memory cells and have voltage levels that change according to the data stored in the memory cells;
a supply section that supplies a voltage of a reference level to act as a comparator reference when determining data stored in the memory cells;
a comparator section that compares the voltage level of the bit line connected to the memory cell subject to reading against the reference level supplied by the supply section; and
a charging section that, in preparation for comparison by the comparator section, charges the bit line connected to the memory cell subject to reading to the voltage of the reference level supplied by the supply section, wherein:
the supply section is configured as a power supply circuit for supplying a reference signal having the voltage of the reference level.

* * * * *